(12) United States Patent
Watanabe et al.

(10) Patent No.: US 12,398,957 B2
(45) Date of Patent: Aug. 26, 2025

(54) HEAT TRANSPORT DEVICE

(71) Applicant: FURUKAWA ELECTRIC CO., LTD., Tokyo (JP)

(72) Inventors: Yosuke Watanabe, Tokyo (JP); Hirofumi Aoki, Tokyo (JP)

(73) Assignee: FURUKAWA ELECTRIC CO., LTD., Tokyo (JP)

( * ) Notice: Subject to any disclaimer, the term of this patent is extended or adjusted under 35 U.S.C. 154(b) by 0 days.

(21) Appl. No.: 18/812,333

(22) Filed: Aug. 22, 2024

(65) Prior Publication Data

US 2024/0410657 A1 Dec. 12, 2024

Related U.S. Application Data

(63) Continuation of application No. PCT/JP2022/048554, filed on Dec. 28, 2022.

(30) Foreign Application Priority Data

Feb. 24, 2022 (JP) ................................ 2022-027148

(51) Int. Cl.
*F28D 15/02* (2006.01)
*F28D 15/04* (2006.01)
*F28D 21/00* (2006.01)

(52) U.S. Cl.
CPC ......... *F28D 15/0266* (2013.01); *F28D 15/04* (2013.01); *F28D 2021/0029* (2013.01)

(58) Field of Classification Search
CPC .... F28D 15/0266; F28D 15/04; F28D 15/046; F28D 2021/0029
See application file for complete search history.

(56) References Cited

U.S. PATENT DOCUMENTS 4,116,266 A * 9/1978 Sawata ................. F28D 15/046
                                                         138/40
4,118,756 A * 10/1978 Nelson ................. H05K 1/0272
                                                         165/104.33

(Continued)

FOREIGN PATENT DOCUMENTS

CN         101055158 A        10/2007
CN         205092233 U         3/2016

(Continued)

OTHER PUBLICATIONS

International Search Report and Written Opinion dated Feb. 14, 2023 from corresponding International Patent Application No. PCT/JP2022/048554, 11 pages.

(Continued)

*Primary Examiner* — Tho V Duong
(74) *Attorney, Agent, or Firm* — Ruggiero McAllister & McMahon LLC

(57) ABSTRACT

The heat transport device includes a first wick structure provided in the internal space of the first heat transport section, and extending from the evaporation section to the condensation section, a second wick structure provided on an inner surface of the second heat transport section, and extending along the heat transport direction of the second heat transport section, and a reflux promoting body provided on the second wick structure, extending along the heat transport direction of the second heat transport section, and having a capillary force, wherein a capillary force of the first wick structure is larger than the capillary force of the reflux promoting body, and the capillary force of the reflux promoting body is larger than a capillary force of the second wick structure, or the capillary force of the reflux promoting body is equal to the capillary force of the second wick structure.

17 Claims, 5 Drawing Sheets

(56) References Cited

U.S. PATENT DOCUMENTS

| | | | |
|---|---|---|---|
| 4,351,388 A * | 9/1982 | Calhoun | F28D 15/046 |
| | | | 165/104.26 |
| 11,747,092 B2 * | 9/2023 | Chen | F28D 15/0233 |
| | | | 165/104.26 |
| 11,913,725 B2 * | 2/2024 | Cheng | F28D 15/0233 |
| 2007/0240858 A1 | 10/2007 | Hou et al. | |
| 2016/0014931 A1 | 1/2016 | Hamakawa | |
| 2020/0018555 A1 | 1/2020 | Lin | |
| 2020/0103175 A1 | 4/2020 | Ben-Menahem et al. | |
| 2020/0173730 A1 | 6/2020 | Watanabe et al. | |
| 2020/0393201 A1 | 12/2020 | Watanabe et al. | |

FOREIGN PATENT DOCUMENTS

| | | | | |
|---|---|---|---|---|
| CN | 110785071 A | 2/2020 | | |
| CN | 212876430 U | 4/2021 | | |
| EP | 3686540 A1 | 7/2020 | | |
| EP | 3758057 A1 | 12/2020 | | |
| EP | 3857152 A1 | 8/2021 | | |
| JP | 3-179766 A | 8/1991 | | |
| JP | 2015-121373 A | 7/2015 | | |
| JP | 2016-009828 A | 1/2016 | | |
| JP | 6582114 B1 * | 9/2019 | | F28D 15/0233 |
| JP | 2020-85430 A | 6/2020 | | |
| JP | 2020-176752 A | 10/2020 | | |
| TW | 201447215 A | 12/2014 | | |
| TW | 202028679 A | 8/2020 | | |
| TW | 202040775 A | 11/2020 | | |
| WO | 2014/157147 A1 | 10/2014 | | |
| WO | 2020/068212 A1 | 4/2020 | | |
| WO | 2020/110973 A1 | 6/2020 | | |
| WO | WO-2020213581 A1 * | 10/2020 | | F28D 15/0233 |

OTHER PUBLICATIONS

International Preliminary Report on Patentability dated Sep. 6, 2024 from corresponding International Patent Application No. PCT/JP2022/048554, 11 pages.

Japanese Office Action dated Apr. 7, 2022 from Corresponding Japanese Patent Application No. 2022-027148, 12 pages.

* cited by examiner

HEAT TRANSPORT DEVICE

CROSS REFERENCE TO RELATED APPLICATIONS

The present application is a continuation application of International Patent Application No. PCT/JP2022/048554 filed on Dec. 28, 2022, which claims the benefit of Japanese Patent Application No. 2022-027148, filed on Feb. 24, 2022. The contents of these applications are incorporated herein by reference in their entirety.

BACKGROUND

Technical Field

The present disclosure relates to a heat transport device that cools heating elements such as electric/electronic components or the like mounted on a substrate such as an electronic circuit board, and particularly relates to a heat transport device that can prevent a working fluid in an evaporation section from drying out even under usage conditions in which a heating element with a high heat generation amount is thermally connected, or in usage conditions in which a flow rate of cooling air is increased.

Background

With high functionality of electronic equipment, many components including heating elements such as electronic components are mounted on a substrate such as an electronic circuit board, inside of the electronic equipment. Further, with high functionality of electronic equipment, the heat generation amounts of the heating elements such as electronic components are increasing. As a unit configured to cool the heating elements such as electronic components, heat transport members such as a vapor chamber, a heat pipe, and a heat sink may be used.

However, when the heat generation amount of a heating element such as an electronic component increases, the flow rate of the working fluid in a gas phase that flows to a condensation section from an evaporation section of the heat transport member increases, so that a reflux of the working fluid in a liquid phase that is in a counterflow relationship with the working fluid in a gas phase has sometimes been hindered. In particular, when the capillary force of the wick structure is relatively small, such as in the case of the wick structure including a plurality of groove portions, the reflux of the working fluid tends to be hindered. When the reflux of the working fluid in a liquid phase is hindered, the working fluid in a liquid phase accumulates in the condensation section of the heat transport member, as a result of which, a reflux amount of the working fluid in a liquid phase to the evaporation section from the condensation section may be insufficient, and the heat transport member may dry out.

Thus, as the heat transport member that cools the heating elements such as electronic components, there is proposed a vapor chamber in which a wick structure having a relatively large capillary force such as a sintered body of metal powder, and the working fluid are housed, which is a vapor chamber including a first section, a second section extending from one end of the first section in a direction to be away from the first section, a fourth section extending from the second section in a left-to-right direction, a third section extending from one end of the first section in a direction to be away from the first section, and a fifth section extending from the third section in a left-to-right direction, in which the wick structure extends throughout all of the first section to the fifth section (Specification of U. S. Patent Application Publication No. 2020/0018555).

In U. S. Patent Application Publication No. 2020/0018555, the heating elements is cooled by transporting heat of the heating element thermally connected to the first section to the fourth section and the fifth section that are condensation sections from the first section that is an evaporation section via the second section and the third section. Further, by the wick structure having a relatively large capillary force such as a sintered body of metal powder, the working fluid in a liquid phase is caused to flow back to the first section from the fourth section and the fifth section.

However, in U. S. Patent Application Publication No. 2020/0018555, the same wick structure extends throughout all of the first section to the fifth section, and therefore the wick structure positioned in the fourth section and the fifth section tends to retain the working fluid in a liquid phase. Accordingly, also in the vapor chamber of U. S. Patent Application Publication No. 2020/0018555, the working fluid in a liquid phase still accumulates in the condensation section, a reflux amount of the working fluid in a liquid phase to the evaporation section from the condensation section may be insufficient, and the working fluid may dry out.

Further, in order to smoothly cool the heating element with a high heat generation amount, a flow rate of cooling air that is to be supplied to the heat transport member may be increased. However, if the flow rate of the cooling air is increased, phase change of the working fluid from a gas phase to a liquid phase is promoted in the condensation section, and in the vapor chamber of U. S. Patent Application Publication No. 2020/0018555, the working fluid in a liquid phase still accumulates in the condensation section, and may dry out.

SUMMARY

The present disclosure is related to providing a heat transport device that can prevent a working fluid in an evaporation section from drying out even under usage conditions in which a heating element with a high heat generation amount is thermally connected, or usage conditions in which a flow rate of cooling air is increased.

The gist of a configuration of a heat sink of the present disclosure is as follows.

[1] A heat transport device including
  a first heat transport section including an evaporation section thermally connected to a heating element, and
  a second heat transport section connected at a condensation section of the first heat transport section, and having a heat transport direction different from a heat transport direction of the first heat transport section,
  the first heat transport section including an integral internal space that provides communication from the evaporation section to a connection portion with the second heat transport section and has a working fluid enclosed in the internal space, the internal space of the first heat transport section communicating with an internal space of the second heat transport section,
  the heat transport device including
  a first wick structure provided in the internal space of the first heat transport section, and extending from the evaporation section to the condensation section, a second wick structure provided on an inner surface of the second heat transport section, and extending along the heat transport direction of the second heat transport section, and a reflux promoting body provided on the second wick structure, extending along the heat transport direction of the second heat transport section, and having a capillary force, wherein a capillary force of the first wick structure is larger than the capillary force of the reflux promoting body, and the capillary force of the reflux promoting body is larger than a capillary force of the second wick structure, or the capillary force of the reflux promoting body is equal to the capillary force of the second wick structure.

[2] The heat transport device as set forth in [1], wherein the first wick structure and the reflux promoting body are connected via a connection member having a capillary force.

[3] The heat transport device as set forth in [2], wherein the capillary force of the first wick structure is larger than the capillary force of the connection member, and the capillary force of the connection member is larger than the capillary force of the reflux promoting body or the capillary force of the connection member is equal to the capillary force of the reflux promoting body.

[4] The heat transport device as set forth in [2] or [3], wherein the connection member is positioned at the connection portion of the first heat transport section and the second heat transport section.

[5] The heat transport device as set forth in any one of [1] to [4], wherein in a section in an orthogonal direction to the heat transport direction of the second heat transport section, the reflux promoting body covers a region of 5% or more of a peripheral length of the section.

[6] The heat transport device as set forth in any one of [1] to [5], wherein the reflux promoting body includes a plurality of reflux promoting units, and capillary forces of the plurality of reflux promoting units are different from one another.

[7] The heat transport device as set forth in any one of [1] to [6], wherein a container of the first heat transport section is of a planar type.

[8] The heat transport device as set forth in any one of [1] to [7], wherein a container of the second heat transport section is of a planar type including an integral internal space.

[9] The heat transport device as set forth in any one of [1] to [7], wherein the second heat transport section is a plurality of tube bodies.

[10] The heat transport device as set forth in any one of [1] to [9], wherein a plurality of the second heat transport sections are provided, and extend in a plurality of directions from the first heat transport section.

[11] The heat transport device as set forth in [9], wherein the plurality of tube bodies extend downward in a gravity direction.

[12] The heat transport device as set forth in any one of [1] to [11], wherein the heat transport device is a heat sink in which a plurality of heat dissipation fins are thermally connected to the second heat transport section.

In an aspect of the heat transport device of the present disclosure, the internal space of the heat transport member including the evaporation section (that is, a heat receiving section) is integrated with communication being provided in a whole of the internal space unlike an internal space of a heat pipe group in which a plurality of heat pipes are disposed in parallel. In the aspect of the heat transport device of the present disclosure, in the first heat transport section, the part that is thermally connected to the heating element that is the object to be cooled functions as the evaporation section (that is, the heat receiving section), and the part that is thermally connected to the second heat transport section functions as the condensation section (that is, a heat dissipation section). In the evaporation section of the first heat transport section, the working fluid receives heat from the heating element and changes in phase from a liquid phase to a gas phase, and in the condensation section of the first heat transport section, part of the working fluid in a gas phase releases latent heat to change in phase from a gas phase to a liquid phase. In the aspect of the heat transport device of the present disclosure, the heat of the heating element is transported to the condensation section of the first heat transport section from the evaporation section of the first heat transport section by the first heat transport section, and is further transported to the second heat transport section from the condensation section of the first heat transport section. Further, the working fluid changing in phase to a gas phase by the first heat transport section receiving heat from the heating element flows to the second heat transport section from the first heat transport section. The working fluid in a gas phase flows to the second heat transport section from the first heat transport section, whereby the second heat transport section receives heat from the first heat transport section, and the heat of the heating element diffuses to the second heat transport section from the first heat transport section. The heat exchange section such as the heat dissipating fins are thermally connected to the second heat transport section, whereby the second heat transport section further transmits the heat received from the first heat transport section to the heat exchange section, and the heat is released to the external environment from the heat exchange section. When the second heat transport section transmits the heat received from the first heat transport section to the heat exchange section, the working fluid in a gas phase that flows to the second heat transport section from the first heat transport section changes in phase to a liquid phase.

Since in the above-described aspect, the heat transport direction of the first heat transport section and the heat transport direction of the second heat transport section differ from each other, the extending direction of the first heat transport section and the extending direction of the second heat transport section differ from each other.

Further, in an aspect in which the container of the first heat transport section is of a planar type, and the container of the second heat transport section is of a planar type including the integral internal space, the heat transport device is configured as a vapor chamber.

Since in the aspect of the heat transport device of the present disclosure, the capillary force of the first wick structure provided in the internal space of the first heat transport section and extending to the condensation section from the evaporation section is larger than the capillary force of the reflux promoting body provided on the second wick structure formed on the inner surface of the second heat transport section, and the capillary force of the reflux promoting body is larger than the capillary fore of the second wick structure, or is equal to the capillary force of the second wick structure, the second wick structure and the reflux promoting body are provided on the inner surface of the second heat transport section, and the capillary force of the first wick structure provided in the first heat transport section including the evaporation section is in a mode of being relatively large. Consequently, according to the aspect of the heat transport device of the present disclosure, a reflux of the working fluid in a liquid phase to the direction of the connection portion with the first heat transport section from the tip end portion of the second heat transport section, and a reflux to the evaporation section from the condensation section of the first heat transport section are facilitated even under usage conditions in which the heating element with a high heat generation amount is thermally connected, or usage conditions in which a flow rate of cooling air is increased. Further, according to the aspect of the heat transport device of the present disclosure, the second wick structure and the reflux promoting body that are provided on the inner surface of the second heat transport section both have relatively small capillary forces, and therefore it is possible to prevent the working fluid in a liquid phase from being retained and accumulating in the second heat transport section. Further, according to the aspect of the heat transport device of the present disclosure, the working fluid in a liquid phase that flows back to the direction of the connection portion with the first heat transport section from the tip end portion of the second heat transport section in the second wick structure is protected from the flow of the working fluid in a gas phase that is a counterflow, by the reflux promoting body, and further, the reflux promoting body also contributes to the reflux of the working fluid in a liquid phase to the direction of the connection portion with the first heat transport section from the tip end portion of the second heat transport section. From the above, according to the aspect of the heat transport device of the present disclosure, it is possible to prevent the working fluid in the evaporation section from drying out even under the usage conditions in which the heating element with a high heat generation amount is thermally connected, or the usage conditions in which the flow rate of cooling air is increased.

According to the aspect of the heat transport device of the present disclosure, the first wick structure and the reflux promoting body are connected via the connection member having a capillary force, and thereby the reflux of the working fluid in a liquid phase to the first heat transport section from the second heat transport section is further facilitated.

According to the aspect of the heat transport device of the present disclosure, the capillary force of the first wick structure is larger than the capillary force of the connection member, and the capillary force of the connection member is larger than the capillary force of the reflux promoting body, or is equal to the capillary force of the reflux promoting body, whereby the capillary force increases as the working fluid in a liquid phase flows to the first heat transport section from the second heat transport section, so that it is possible to prevent the working fluid in the evaporation section from drying out more reliably even under the usage conditions in which the heating element with a high heat generation amount is thermally connected, or the usage conditions in which the flow rate of the cooling air is increased.

According to the aspect of the heat transport device of the present disclosure, in the section in the orthogonal direction to the heat transport direction of the second heat transport section, the reflux promoting body covers the region of 5% or more of the peripheral length of the section, and thereby the reflux promoting body further promotes a reflux of the working fluid in a liquid phase to the direction of the connection portion with the first heat transport section from the tip end portion of the second heat transport section.

According to the aspect of the heat transport device of the present disclosure, the reflux promoting body includes the plurality of reflux promoting units, and the capillary forces of the plurality of reflux promoting units are different from one another, whereby the capillary force of the reflux promoting body can be increased as progress from the tip end portion of the second heat transport section towards the direction of the connection portion with the first heat transport section, so that a reflux of the working fluid in a liquid phase to the direction of the connection section with the first heat transport section from the tip end portion of the second heat transport section is further facilitated.

According to the aspect of the heat transport device of the present disclosure, the plurality of second heat transport sections are provided and extend in the plurality of directions from the first heat transport section, and thereby the heat that is transported to the second heat transport section from the first heat transport section is transported in the plurality of directions different from the extending direction (heat transport direction) of the first heat transport section, so that it is possible to prevent increase in size of the heat transport device and, as a result, it is possible to achieve space saving.

DETAILED DESCRIPTION

Figure 1:
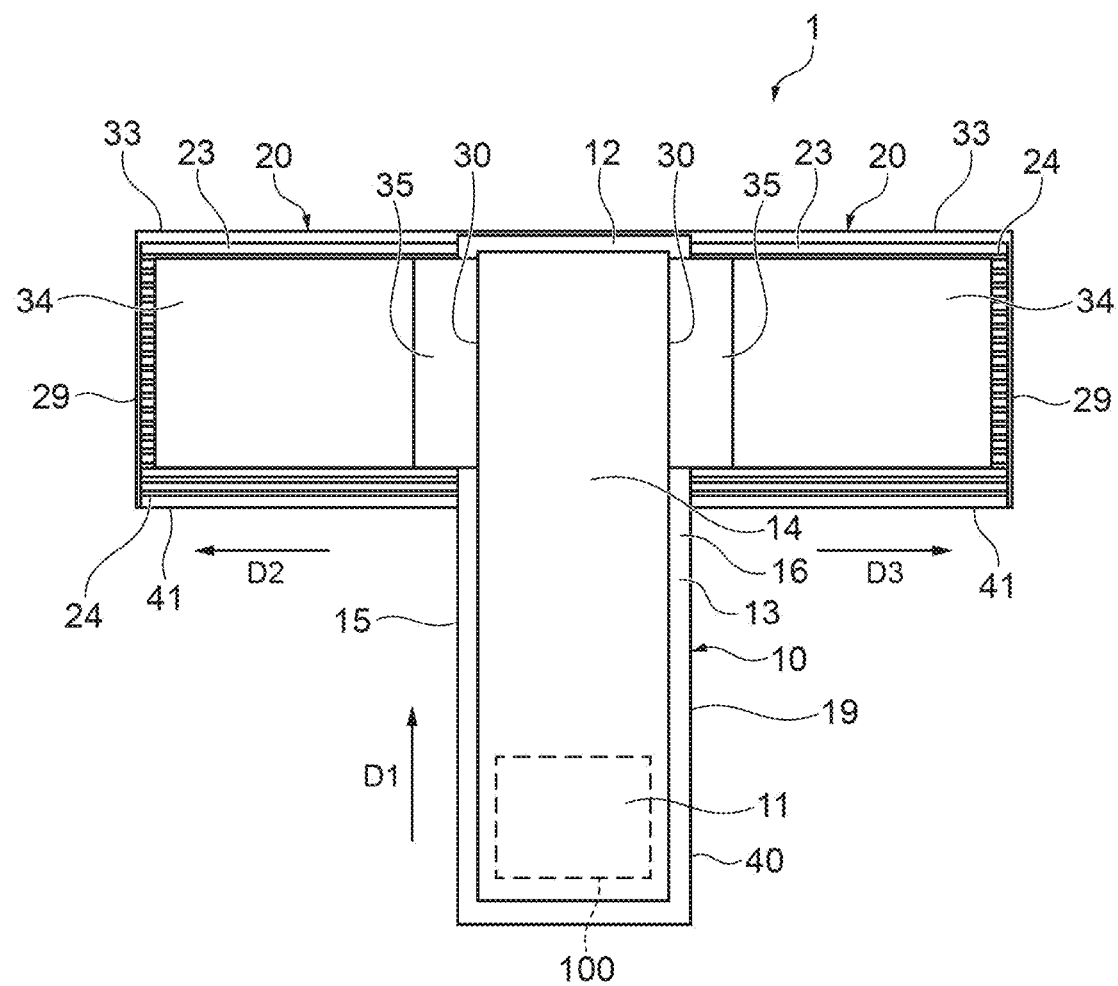
FIG. 1 is a sectional plan view explaining an outline of an inside of a heat transport device according to a first embodiment of the present disclosure.
Figure 2:
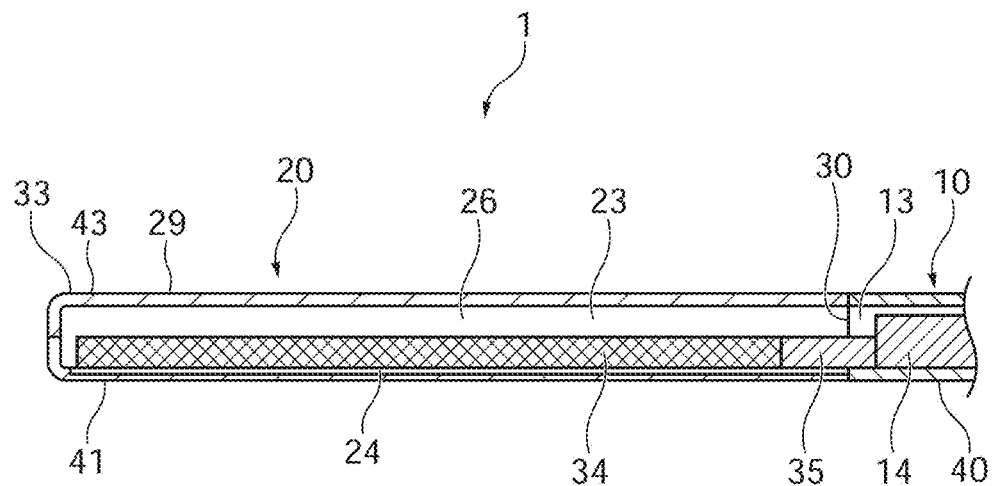
FIG. 2 is a sectional front view explaining an outline of an inside of a second heat transport section of the heat transport device according to the first embodiment of the present disclosure.
Figure 3:
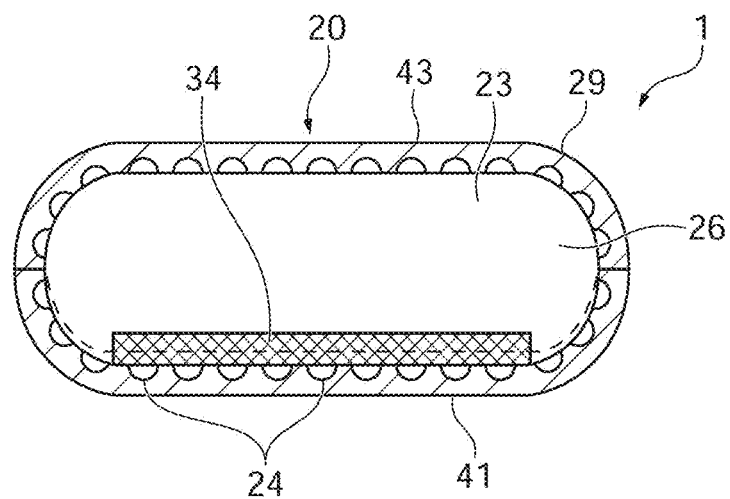
FIG. 3 is a sectional side view explaining the outline of the inside of the second heat transport section of the heat transport device according to the first embodiment of the present disclosure.
Figure 4:
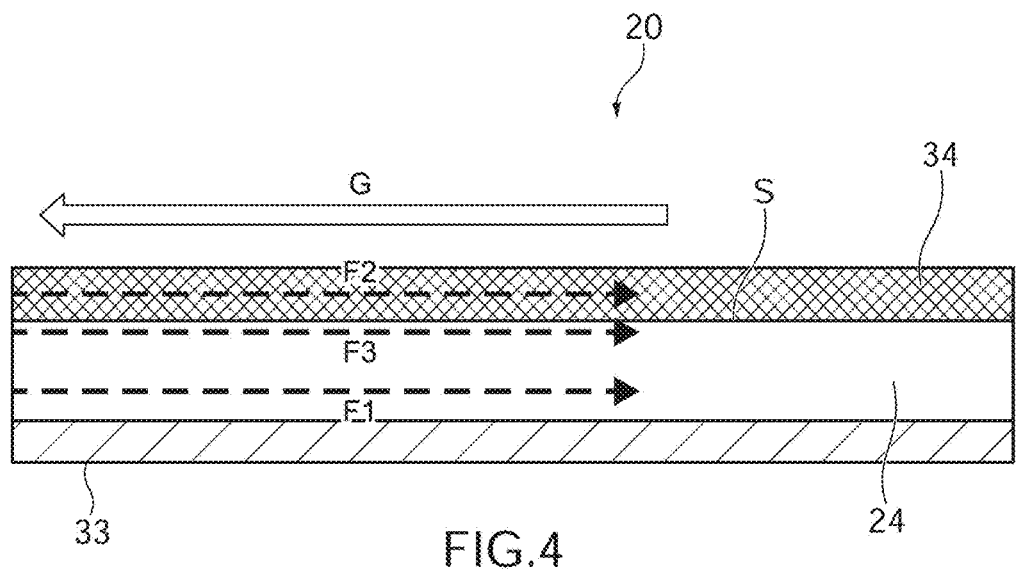
FIG. 4 is an explanatory view explaining a flow of a working fluid of the inside of the second heat transport section of the heat transport device according to the first embodiment of the present disclosure.

Hereinafter, a heat transport device according to each of embodiments of the present disclosure will be described with use of the drawings. First, a heat transport device according to a first embodiment of the present disclosure will be described. Note that FIG. 1 is a sectional plan view explaining an outline of an inside of the heat transport device according to the first embodiment of the present disclosure. FIG. 2 is a sectional front view explaining an outline of an inside of a second transport section of the heat transport device according to the first embodiment of the present disclosure. FIG. 3 is a sectional side view explaining the outline of the inside of the second heat transport section of the heat transport device according to the first embodiment of the present disclosure. FIG. 4 is an explanatory view explaining a flow of a working fluid in the inside of the second heat transport section of the heat transport device according to the first embodiment of the present disclosure.

As shown in FIG. 1, a heat transport device 1 according to the first embodiment of the present disclosure includes a first heat transport section 10 including an evaporation section 11 thermally connected to a heating element 100, and a second heat transport section 20 connected at a condensation section 12 of the first heat transport section 10, and having heat transport directions D2 and D3 that are different from a heat transport direction D1 of the first heat transport section 10. The second heat transport section 20 is connected to the first heat transport section 10 at the condensation section 12 of the first heat transport section 10, and thereby, a connection portion 30 of the first heat transport section 10 and the second heat transport section 20 is formed. Further, an internal space of the first heat transport section 10 communicates with an internal space of the second heat transport section 20. In the heat transport device 1, the first heat transport section 10 has the integral internal space that provides communication from the evaporation section 11 to the connection portion 30 with the second heat transport section 20, and has a working fluid enclosed in the internal space.

The first heat transport section 10 has a container 19 having a hollow cavity portion 13, and a working fluid flowing through the cavity portion 13 (not illustrated in FIG. 1). The container 19 is formed by overlapping one plate-shaped body 40 positioned on an installation surface side of the heat transport device 1 and another plate-shaped body (not illustrated in FIG. 1) facing the one plate-shaped body 40 with each other.

The one plate-shaped body 40 is in a plate shape having side walls provided upright from a plane portion at edge portions of the plane portion. The other plate-shaped body is also in a plate shape having side walls provided upright from a plane portion at edge portions of the plane portion. Accordingly, the one plate-shaped body 40 and the other plate-shaped body are each in a recessed shape. By overlapping the one plate-shaped body 40 and the other plate-shaped body with each other in a state in which the recessed shapes face each other, the cavity portion 13 of the container 19 is formed. Accordingly, in the heat transport device 1, a shape of the container 19 of the first heat transport section 10 is a planar shape. The cavity portion 13 of the container 19 is an internal space sealed to an external environment and is decompressed by degassing.

Of an outer surface of the container 19, a part to which the heating element 100 that is an object to be cooled is thermally connected functions as the evaporation section 11. The heating element 100 is thermally connected to the container 19 of the first heat transport section 10, and thereby the heating element 100 is cooled. In the first heat transport section 10, the heating element 100 is thermally connected to one end in an extending direction that is the heat transport direction D1 of the first heat transport section 10. Accordingly, the evaporation section 11 is formed at the one end in the extending direction of the first heat transport section 10.

The first heat transport section 10 extends in a predetermined direction from a position of the heating element 100, and the second heat transport section 20 is connected to another end facing the one end in the extending direction of the first heat transport section 10. The other end of the first heat transport section 10 to which the second heat transport section 20 is connected functions as the condensation section 12 of the first heat transport section 10.

In the first heat transport section 10, a middle portion that is positioned between the evaporation section 11 positioned at the one end of the container 19 and the condensation section 12 positioned at the other end of the container 19 functions as a heat-insulating portion 15. Heat that is transmitted to the evaporation section 11 from the heating element 100 is transported to the condensation section 12 from the evaporation section 11 via the heat-insulating portion 15.

As shown in FIG. 1, in the cavity portion 13 of the first heat transport section 10, a first wick structure 14 having a capillary force is housed. The first wick structure 14 is provided in the internal space of the first heat transport section 10, and extends to the condensation section 12 from the evaporation section 11. The first wick structure 14 extends to the condensation section 12 from the evaporation section 11 of the container 19 on a substantially entire surface in a width direction of the first heat transport section 10.

As the first wick structure 14, it is possible to cite, for example, a sintered body of metal powder such as copper powder, metal mesh formed of a metal wire, nonwoven cloth, metal fiber and the like, though the first wick structure 14 is not particularly limited. In the first heat transport section 10, as the first wick structure 14, a sintered body of metal powder is used. Further, in the first heat transport section 10, grooves (a plurality of thin grooves, not illustrated) may be further provided on an inner surface of the container 19. In the cavity portion 13, a part in which the first wick structure 14 is not provided functions as a vapor flow path 16 through which the working fluid in a gas phase flows. The vapor flow path 16 extends to the condensation section 12 from the evaporation section 11 of the container 19 correspondingly to that the first wick structure 14 extends to the condensation section 12 from the evaporation section 11 of the container 19. The first heat transport section 10 transports heat of the heating element 100 received in the evaporation section 11 to the condensation section 12 from the evaporation section 11, by heat transport properties due to operation of the working fluid.

As shown in FIG. 1, the second heat transport section 20 the internal space of which communicates with the cavity portion 13 of the container 19 of the first heat transport section 10 is provided on a side surface of the condensation section 12 of the first heat transport section 10. The second heat transport section 20 includes a container 29 having a hollow cavity portion 23. The cavity portion 23 of the second heat transport section 20 communicates with the cavity portion 13 of the first heat transport section 10 via the connection portion 30.

The container 29 is formed by overlapping one plate-shaped body 41 positioned on an installation surface side of the heat transport device 1 and another plate-shaped body (not illustrated in FIG. 1) facing the one plate-shaped body 41 with each other. The one plate-shaped body 41 is in a plate shape having side walls provided upright from a plane portion at edge portions of the plane portion. The other plate-shaped body is also in a plate shape having side walls provided upright from a plane portion at edge portions of the plane portion. Accordingly, the one plate-shaped body 41 and the other plate-shaped body are each in a recessed shape. By overlapping the one plate-shaped body 41 and the other plate-shaped body with each other in a state in which the recessed shapes face each other, the cavity portion 23 of the container 29 is formed. Accordingly, in the heat transport device 1, a shape of the container 29 of the second heat transport section 20 is a planar shape.

The cavity portion 23 of the container 29 is an internal space sealed to the external environment of the heat transport device 1 and is decompressed by degassing. The working fluid is flowable between the cavity portion 13 of the container 19 of the first heat transport section 10 and the cavity portion 23 of the container 29 of the second heat transport section 20. From the above, the working fluid flowing through the cavity portion 13 of the first heat transport section 10 is enclosed in a space from the cavity portion 13 of the first heat transport section 10 to the cavity portion 23 of the second heat transport section 20.

A shape of the second heat transport section 20 is not particularly limited, and in the heat transport device 1, the container 29 of the second heat transport section 20 is a planar shape having the integrated internal space.

The second heat transport section 20 extends in a substantially orthogonal direction to the heat transport direction of the first heat transport section 10, along a planar direction of the condensation section 12 of the first heat transport section 10. Accordingly, the second heat transport section 20 may be installed along a direction orthogonal to a gravity direction. In the heat transport device 1, the extending direction of the second heat transport section 20 is not parallel with the extending direction (heat transport direction) of the first heat transport section 10, so that the heat transported from the first heat transport section 10 is transported in a direction different from the extending direction of the first heat transport section 10 by the second heat transport section 20. Accordingly, it is possible to prevent increase in size of the heat transport device 1 in the heat transport direction of the first heat transport section 10, and therefore it is possible to achieve space saving of the heat transport device 1.

A plurality of second heat transport sections 20 are provided, and extend in a plurality of directions from the first heat transport section 10. In the heat transport device 1, two second heat transport sections 20 are provided, and the second heat transport sections 20 extend in both left and right directions with the first heat transport section 10 as a center. Since the plurality of second heat transport sections 20 extend in a plurality of directions (two directions in the heat transport device 1) from the first heat transport section 10, the heat that is transported to the second heat transport sections 20 from the first heat transport section 10 diverges and is transported in a plurality of directions (two directions in the heat transport device 1) different from the extending direction of the first heat transport section 10. Accordingly, it is possible to prevent increase in size of the heat transport device 1 in the extending direction of the first heat transport section 10 more reliably.

As shown in FIGS. 1 to 3, a second wick structure 24 extending along the heat transport direction of the second heat transport section 20 is provided on an inner surface of the second heat transport section 20. The second wick structure 24 has a function of causing the working fluid in a liquid phase to flow back in a direction of the connection portion 30 with the first heat transport section 10 from a tip end portion 33 of the second heat transport section 20.

The second wick structure 24 is a wick structure having a capillary force with a structure different from a structure of the first wick structure 14 housed in the container 19. In the heat transport device 1, as the second wick structure 24, grooves (a plurality of thin grooves) are formed on an inner surface of the second heat transport section 20. From the above, in the heat transport device 1, the second wick structure 24 is a different type of wick structure from the first wick structure 14. The grooves that are the second wick structure 24 extend along the heat transport direction of the second heat transport section 20. In the heat transport device 1, the second wick structure 24 extends from the tip end portion 33 of the second heat transport section 20 to the connection portion 30 with the first heat transport section 10.

Further, in the second heat transport section 20, a reflux promoting body 34 that extends along the heat transport direction of the second heat transport section 20 and has a capillary force is provided on the second wick structure 24. The reflux promoting body 34 has a function of promoting the working fluid in a liquid phase flowing back to a direction of the connection portion 30 with the first heat transport section 10 from the tip end portion 33 of the second heat transport section 20. The reflux promoting body 34 is provided in a mode of being in contact with the second wick structure 24. In the heat transport device 1, the reflux promoting body 34 extends from the tip end portion 33 of the second heat transport section 20 to a vicinity of the connection portion 30 with the first heat transport section 10.

The reflux promoting body 34 is a wick member that has a capillary force with a structure different from structures of the first wick structure 14 housed in the container 19 and the second wick structure 24 housed in the container 29. As the reflux promoting body 34, it is possible to cite, for example, a sintered body of metal powder such as copper powder, metal mesh formed of a metal wire, nonwoven fabric, metal fiber and the like, though the reflux promoting body 34 is not particularly limited. In the heat transport device 1, the entire reflux promoting body 34 is formed of a same member, and the entire reflux promoting body 34 has a substantially same capillary force. In the heat transport device 1, a sheet-shaped metal mesh is used as the reflux promoting body 34. From the above, in the heat transport device 1, the reflux promoting body 34 is a wick member of a different type from the first wick structure 14 and the second wick structure 24. In the cavity portion 23 of the second heat transport section 20, a part in which the reflux promoting body 34 and the second wick structure 24 are not provided functions as a vapor flow path 26 through which the working fluid in a gas phase flows. The vapor flow path 26 extends from the connection portion 30 with the first heat transport section 10 to the tip end portion 33 of the container 29 of the second heat transport section 20. The second heat transport section 20 transports the heat of the heating element 100 received from the first heat transport section 10 to a direction of the tip end portion 33 of the second heat transport section 20 from the connection portion 30 with the first heat transport section 10 by the heat transport properties due to the operation of the working fluid.

Though an installation position of the reflux promoting body 34 is not particularly limited as long as the installation position is on the inner surface of the container 29 of the second heat transport section 20, it is preferable that, in a section in an orthogonal direction to the heat transport direction of the second heat transport section 20, the reflux promoting body 34 covers a region of 5% or more of a peripheral length of the section, from a viewpoint that the working fluid in a liquid phase can flow back more smoothly to the direction of the connection portion 30 with the first heat transport section 10 from the tip end portion 33 of the second heat transport section 20, by further promoting the reflux of the working fluid in a liquid phase to the direction of the connection portion 30 with the first heat transport section 10 from the tip end portion 33 of the second heat transport section 20. Further, when the second heat transport section 20 is installed so that the extending direction of the second heat transport section 20 is substantially orthogonal to the gravity direction, it is preferable that the reflux promoting body 34 covers a region of 25% or more and 50% or less of the peripheral length of the aforementioned section, from a viewpoint of reliably securing the vapor flow path 26 while further promoting the reflux of the working fluid in a liquid phase to the direction of the connection portion 30 with the first heat transport section 10 from the tip end portion 33 of the second heat transport section 20. Further, when the second heat transport section 20 is installed so that the tip end portion 33 of the second heat transport section 20 is lower in the gravity direction than the connection portion 30 with the first heat transport section 10, it is preferable that the reflux promoting body 34 covers a region of 50% or more and 100% or less of the peripheral length of the aforementioned section, from a viewpoint of reliably promoting reflux of the working fluid in a liquid phase to the direction of the connection portion 30 from the tip end portion 33 of the second heat transport section 20.

As shown in FIGS. 2 and 3, in the heat transport device 1, of the inner surface of the container 29 formed by overlapping the one plate-shaped body 41 and the other plate-shaped body 43 facing the one plate-shaped body 41 with each other, the reflux promoting body 34 is provided on the one plate-shaped body 41 that is the plate-shaped body positioned lower in the gravity direction, and is not provided on the other plate-shaped body 43.

In the heat transport device 1, a capillary force of the first wick structure 14 is in a mode of being larger than the capillary force of the reflux promoting body 34. Further, the capillary force of the reflux promoting body 34 is in a mode of being larger than the capillary force of the second wick structure 24, or being equal to the capillary force of the second wick structure 24.

As shown in FIGS. 1 and 2, the first wick structure 14 provided in the first heat transport section 10, and the reflux promoting body 34 provided in the second heat transport section 20 may be connected via a connection member 35 having a capillary force. The connection member 35 is positioned at the connection portion 30 of the first heat transport section 10 and the second heat transport section 20 and a vicinity of the connection portion 30.

The connection member 35 is a wick member that has a capillary force with a structure different from the structures of the first wick structure 14 housed in the container 19, and the second wick structure 24 and the reflux promoting body 34 that are housed in the container 29. As the connection member 35, it is possible to cite, for example, metal mesh, a braided body of a metal wire, metal fiber and the like. In the heat transport device 1, the connection member 35 may be a wick member of a different type from the first wick structure 14, the second wick structure 24 and the reflux promoting body 34.

In the heat transport device 1, the capillary force of the first wick structure 14 is in a mode of being larger than the capillary force of the connection member 35. Further, the capillary force of the connection member 35 is in a mode of being larger than the capillary force of the reflux promoting body 34, or substantially equal to the capillary force of the reflux promoting body 34.

The working fluid that changes in phase from a gas phase to a liquid phase inside of the second heat transport section 20 flows back to the direction of the connection portion 30 from the tip end portion 33 of the second heat transport section 20, inside of the second wick structure 24 and inside of the reflux promoting body 34 by the capillary force of the second wick structure 24 and the capillary force of the reflux promoting body 34. The working fluid in a liquid phase that flows back to the vicinity of the connection portion 30 flows to one end of the connection member 35 from the second wick structure 24 and the reflux promoting body 34. The working fluid in a liquid phase that flows to the one end of the connection member 35 flows to another end from the one end in the connection member 35 and flows back to the first wick structure 14 of the first heat transport section 10 from the other end of the connection member 35.

Accordingly, by providing the connection member 35, the reflux of the working fluid in a liquid phase to the first heat transport section 10 from the second heat transport section 20 is further facilitated. From the above, flowing performance of the working fluid in a liquid phase between the second heat transport section 20 and the first heat transport section 10 is improved by the connection member 35, and therefore the heat transport properties of the heat transport device 1 are improved.

Note that when the connection member 35 is not provided, it is preferable to adopt a structure in which the reflux promoting body 34 contacts the first wick structure 14 in the vicinity of the connection portion 30, from a viewpoint of improving the flowing performance of the working fluid in a liquid phase between the second heat transport section 20 and the first heat transport section 10.

As the materials of the container 19 and the container 29, it is possible to cite, for example, copper, a copper alloy, aluminum, an aluminum alloy, nickel, a nickel alloy, stainless steel, titanium, a titanium alloy and the like. The working fluid to be enclosed in the heat transport device 1 is properly selectable according to compatibility with the materials of the container 19 and the container 29, and it is possible to cite, for example, water, fluorocarbons, hydrofluoroether (HFE), cyclopentane, ethylene glycol, mixtures of them, and the like.

Thicknesses of the container 19 and the container 29 are properly selectable based on mechanical strength, weight and the like, and it is possible to cite, for example, 0.5 to 3 mm. Widths of the container 19 and the container 29 are properly selectable according to usage conditions of the heat transport device 1 and the like, and it is possible to cite, for example, 4 to 20 mm.

Next, a mechanism of a heat transport function of the heat transport device 1 will be described with use of FIGS. 1 to 3. First, the heating element 100 that is the object to be cooled is thermally connected to one end of the container 19 of the first heat transport section 10 to cause the one end of the container 19 to function as the evaporation section 11. When the one end of the container 19 receives heat from the heating element 100, the heat is transmitted to the working fluid in a liquid phase of the cavity portion 13 at the one end of the container 19, and the working fluid in a liquid phase changes in phase to the working fluid in a gas phase in the cavity portion 13 at the one end of the container 19. The working fluid in a gas phase flows in the vapor flow path 16 from the one end of the container 19 to the other end that is the condensation section 12. The working fluid in a gas phase flows to the other end from the one end of the container 19, and thereby the first heat transport section 10 transports heat to the other end from the one end of the first heat transport section 10. When a heat exchange section (not illustrated) is thermally connected at the other end of the container 19, part of the working fluid in a gas phase that flows to the other end of the container 19 releases latent heat to change in phase to the working fluid in a liquid phase by a heat exchange action of the heat exchange section, and the released latent heat is transmitted to the heat exchange section. The heat that is transmitted to the heat exchange section is released to the external environment of the heat transport device 1 via the heat exchange section. The working fluid changing in phase to a liquid phase at the other end of the container 19 flows back to the one end from the other end of the container 19 by the capillary force of the first wick structure 14.

Further, since the cavity portion 13 of the first heat transport section 10 and the cavity portion 23 of the second heat transport section 20 communicate with each other, of the working fluid that changes in phase to a gas phase from a liquid phase in the evaporation section 11 of the first heat transport section 10, the working fluid that does not change in phase to a liquid phase in the condensation section 12 of the first heat transport section 10 flows into the cavity portion 23 of the second heat transport section 20 from the cavity portion 13 of the first heat transport section 10 via the connection portion 30. The working fluid in a gas phase that has flowed into the cavity portion 23 of the second heat transport section 20 from the cavity portion 13 of the first heat transport section 10 flows through the vapor flow path 26 in the direction of the tip end portion 33 of the second heat transport section 20 from the connection portion 30. The working fluid in a gas phase flows through the vapor flow path 26 to the direction of the tip end portion 33 of the second heat transport section 20 from the connection portion 30, and thereby the second heat transport section 20 transports heat to the direction of the tip end portion 33 from the connection portion 30. When the heat exchange section (not illustrated) is thermally connected to the container 29 of the second heat transport section 20, the working fluid in a gas phase that has flowed into the cavity portion 23 of the second heat transport section 20 releases latent heat inside of the second heat transport section 20 and changes in phase to the working fluid in a liquid phase by the heat exchange action of the heat exchange section. The latent heat released to inside of the second heat transport section 20 is transmitted to the heat exchange section thermally connected to the second heat transport section 20. The heat that is transmitted to the heat exchange section is released to the external environment of the heat transport device 1 via the heat exchange section. The working fluid that changes in phase to a liquid phase from a gas phase inside of the second heat transport section 20 flows back to the direction of the connection portion 30 from the tip end portion 33 of the second heat transport section 20 by the capillary forces of the second wick structure 24 and the reflux promoting body 34 provided on the inner surface of the second heat transport section 20. The working fluid in a liquid phase that flows back to the vicinity of the connection portion 30 from the tip end portion 33 of the second heat transport section 20 flows back to the first wick structure 14 at the other end (condensation section 12) of the container 19 via the connection member 35. The working fluid in a liquid phase that has flowed back to the first wick structure 14 flows back to the one end (evaporation section 11) of the container 19 from the other end (condensation section 12) of the container 19 by the capillary force of the first wick structure 14.

In the heat transport device 1, the capillary force of the first wick structure 14 provided in the cavity portion 13 of the first heat transport section 10 and extending to the condensation section 12 from the evaporation section 11 is larger than the capillary force of the reflux promoting body 34 provided on the second wick structure 24 formed on the inner surface of the second heat transport section 20, and the capillary force of the reflux promoting body 34 is larger than the capillary force of the second wick structure 24 or the capillary force of the reflux promoting body 34 is substantially equal to the capillary force of the second wick structure 24. Therefore, the second wick structure 24 and the reflux promoting body 34 are provided on the inner surface of the second heat transport section 20, and the capillary force of the first wick structure 14 provided in the first heat transport section 10 including the evaporation section 11 is in a mode of being relatively large. Accordingly, in the heat transport device 1, even under the usage conditions in which the heating element 100 with a high heat generation amount is thermally connected, or usage conditions in which the flow rate of the cooling air is increased, the reflux of the working fluid in a liquid phase to the direction of the connection portion 30 with the first heat transport section 10 from the tip end portion 33 of the second heat transport section 20, and the reflux of the working fluid in a liquid phase to the evaporation section 11 from the condensation section 12 of the first heat transport section 10 are facilitated. Further, in the heat transport device 1, the second wick structure 24 and the reflux promoting body 34 that are provided on the inner surface of the second heat transport section 20 both have relatively small capillary forces, and therefore it is possible to prevent the working fluid in a liquid phase from being retained and accumulating in the second heat transport section 20.

Further, as shown in FIG. 4, in the heat transport device 1, a working fluid F1 in a liquid phase that flows back to the direction of the connection portion 30 with the first heat transport section 10 from the tip end portion 33 of the second heat transport section 20 in the second wick structure 24 is protected from a flow of a working fluid G in a gas phase that is a counterflow, by the reflux promoting body 34, and further, the reflux promoting body 34 also contributes to reflux of a working fluid F2 in a liquid phase to the direction of the connection portion 30 with the first heat transport section 10 from the tip end portion 33 of the second heat transport section 20. Furthermore, an interface portion S between the second wick structure 24 and the reflux promoting body 34 also contributes to reflux of a working fluid F3 in a liquid phase to the direction of the connection portion 30 with the first heat transport section 10 from the tip end portion 33 of the second heat transport section 20. From the above, in the heat transport device 1, it is possible to prevent the working fluid in the evaporation section 11 from drying out even under the usage conditions in which the heating element 100 with a high heat generation amount is thermally connected or usage conditions in which the flow rate of the cooling air is increased.

Further, since in the heat transport device 1, the capillary force of the first wick structure 14 is larger than the capillary force of the connection member 35, and the capillary force of the connection member 35 is larger than the capillary force of the reflux promoting body 34, or the capillary force of the connection member 35 is substantially equal to the capillary force of the reflux promoting body 34, the capillary force is in a mode of becoming larger as the working fluid in a liquid phase flows to the first heat transport section 10 from the second heat transport section 20, so that it is possible to prevent the working fluid in the evaporation section 11 from drying out more reliably even under the usage conditions in which the heating element 100 with a high heat generation amount is thermally connected, or the usage conditions in which the flow rate of the cooling air is increased.

Figure 5:
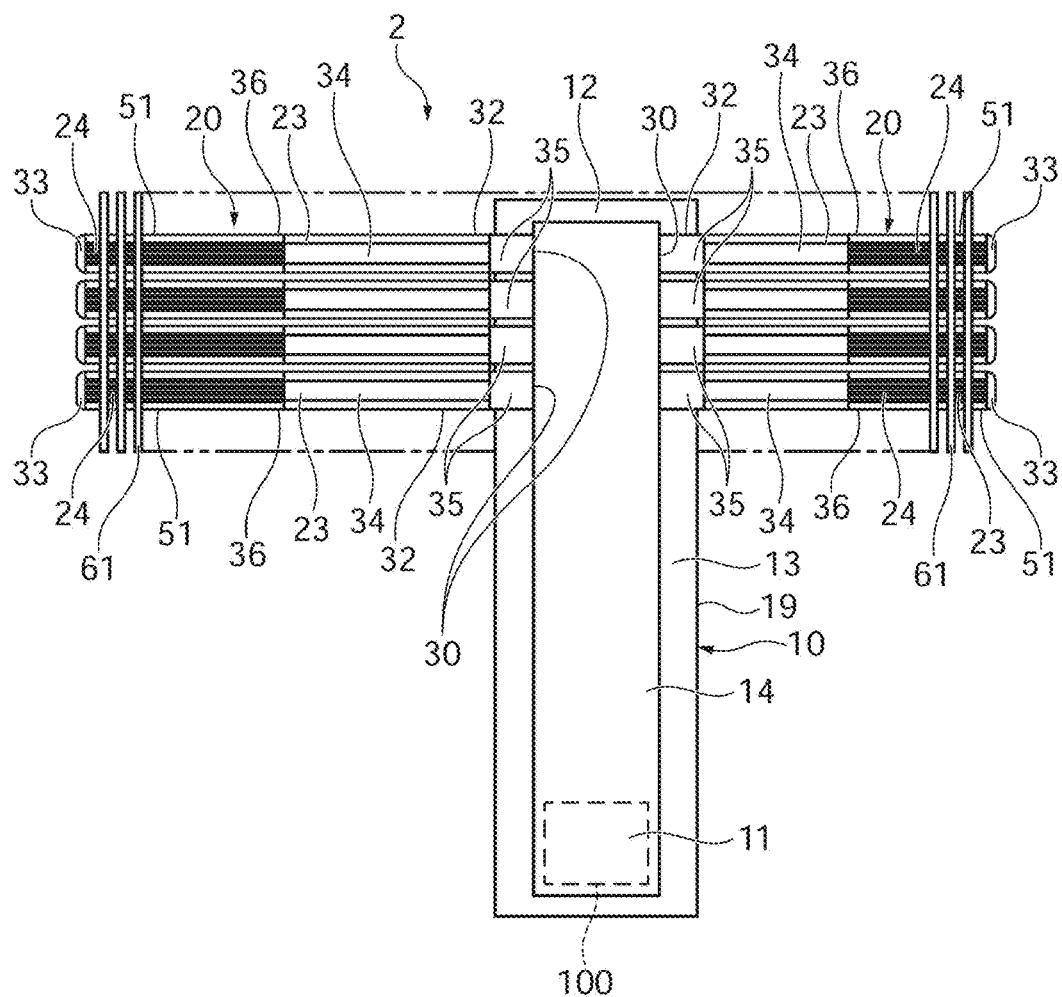
FIG. 5 is a sectional plan view explaining an outline of an inside of a heat transport device according to a second embodiment of the present disclosure.
Figure 6:
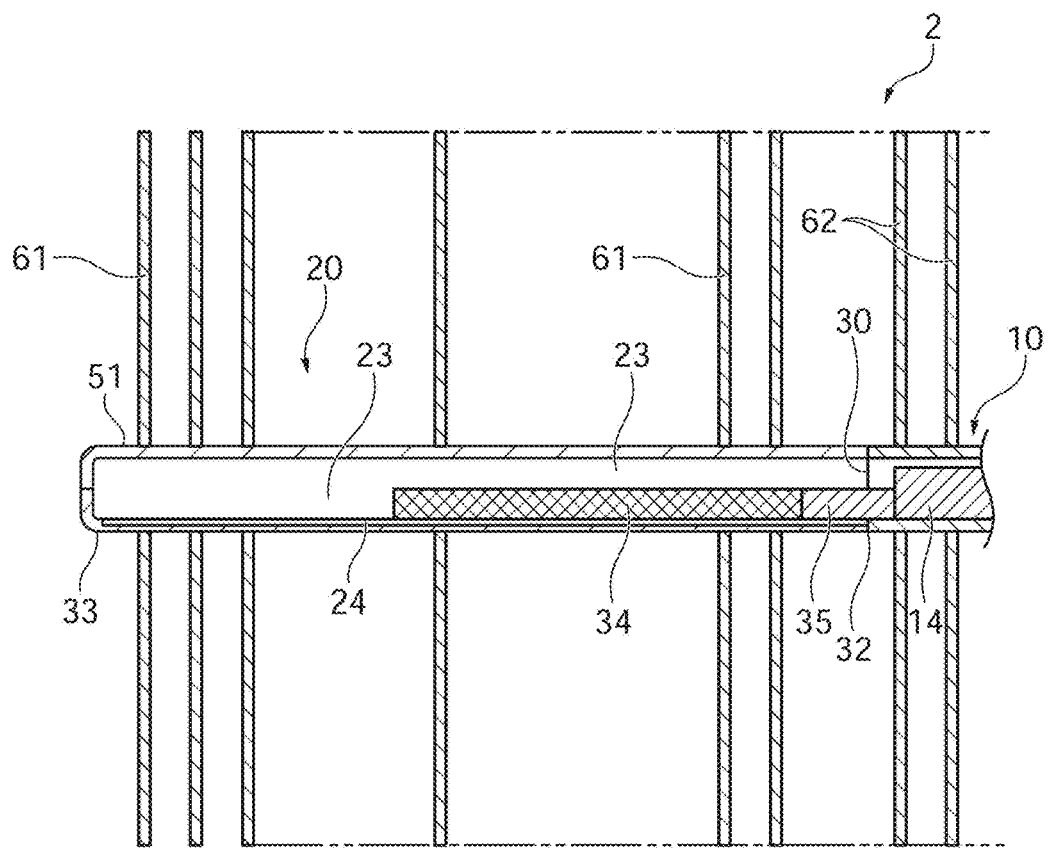
FIG. 6 is a sectional front view explaining an outline of an inside of a second heat transport section of the heat transport device according to the second embodiment of the present disclosure.
Figure 7:
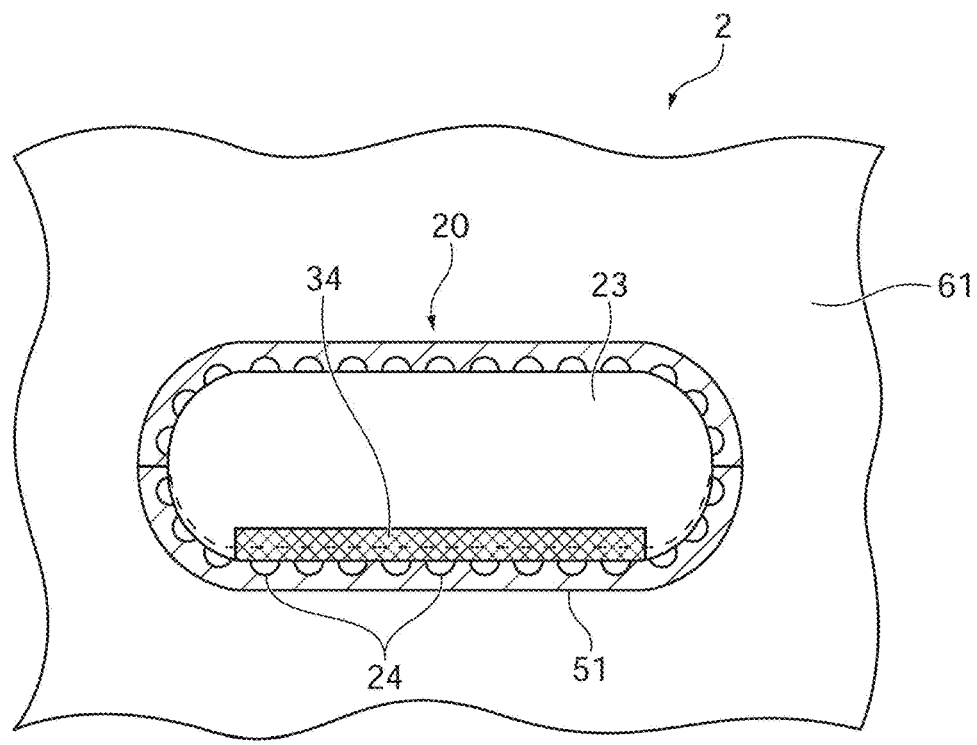
FIG. 7 is a sectional side view explaining the outline of the inside of the second heat transport section of the heat transport device according to the second embodiment of the present disclosure.

Next, a heat transport device according to a second embodiment of the present disclosure will be described with use of the drawings. Note that the heat transport device according to the second embodiment shares a main part with the heat transport device according to the first embodiment, and therefore, same components as the components of the heat transport device according to the first embodiment will be described by using the same reference signs. Note that FIG. 5 is a sectional plan view explaining an outline of an inside of the heat transport device according to the second embodiment of the present disclosure. FIG. 6 is a sectional front view explaining an outline of an inside of a second heat transport section of the heat transport device according to the second embodiment of the present disclosure. FIG. 7 is a sectional side view explaining the outline of the inside of the second heat transport section of the heat transport device according to the second embodiment of the present disclosure.

In the heat transport device 1 according to the first embodiment, the second heat transport section 20 is a planar type of container including the integral internal space, but as shown in FIG. 5, in a heat transport device 2 according to the second embodiment, a second heat transport section 20 is a plurality of tube bodies 51, 51, 51 . . . instead of the planar type of container including the integral internal space.

The second heat transport section 20 includes a plurality of tube bodies 51 each having a hollow cavity portion 23. The plurality of tube bodies 51, 51, 51 . . . are disposed in parallel along a radial direction of the tube body 51, and the one second heat transport section 20 is formed. A longitudinal direction of the tube body 51 is a heat transport direction of the tube body 51, and thus, a heat transport direction of the second heat transport section 20.

An end portion (hereinafter, may be referred to as "base portion") 32, on a first heat transport section 10 side, of the tube body 51 is opened, and an end portion opposite to the base portion 32 (that is, a tip end portion 33) is closed. The cavity portion 23 of the tube body 51 forming the second heat transport section 20 communicates with a cavity portion 13 of the first heat transport section 10 via a connection portion 30. The cavity portion 23 of the tube body 51 is an internal space sealed to an external environment of the heat transport device 2 and is decompressed by degassing. A working fluid is flowable between the cavity portion 13 of the first heat transport section 10 and the cavity portion 23 of the tube body 51.

A through-hole (not illustrated) for mounting the tube body 51 to the container 19 is formed in a side surface portion of the container 19 of the first heat transport section 10. A shape and a size of the through-hole correspond to a shape and a size of the tube body 51, and the base portion 32 of the tube body 51 is fitted into the through-hole of the container 19, whereby the tube body 51 is connected to the first heat transport section 10. Accordingly, the tube body 51 and the container 19 of the first heat transport section 10 are formed of separate members. Though a method for fixing the tube body 51 mounted to the container 19 is not particularly limited, it is possible to cite, for example, welding, soldering, brazing, and the like. The tube body 51 extends in a substantially orthogonal direction to the heat transport direction of the first heat transport section 10, along a planar direction of a condensation section 12 of the first heat transport section 10. Accordingly, in the heat transport device 2, a longitudinal direction of the tube body 51 may be installed so that the longitudinal direction of the tube body 51 is along a direction orthogonal to the gravity direction.

As shown in FIGS. 5 to 7, a second wick structure 24 extending along the heat transport direction of the tube body 51 is provided on an inner surface of each of the tube bodies 51. The second wick structure 24 has a function of causing the working fluid in a liquid phase to a direction of the connection portion 30 with the first heat transport section 10 from the tip end portion 33 of the tube body 51. Also in the heat transport device 2, the second wick structure 24 extends to the connection portion 30 with the first heat transport section 10 from the tip end portion 33 of the tube body 51. Also in the heat transport device 2, grooves (a plurality of fine grooves) are formed on the inner surface of the tube body 51 as the second wick structure 24.

Further, a reflux promoting body 34 having a capillary force, and extending along the heat transport direction of the second heat transport section 20 is provided on the second wick structure 24 in each of the tube bodies 51. In the heat transport device 2, the reflux promoting body 34 extends to a vicinity of the connection portion 30 with the first heat transport section 10 (that is, a vicinity of the base portion 32) from a center portion 36 in the longitudinal direction of the tube body 51. From the above, in the heat transport device 2, in a region from the tip end portion 33 to the center portion 36 of the tube body 51, the reflux promoting body 34 is not provided, and the second wick structure 24 is exposed. The reflux promoting body 34 is provided in a lower part in the gravity direction and is not provided in an upper part in the gravity direction of the inner surface of the tube body 51. Note that also in the heat transport device 2, the entire reflux promoting body 34 is formed of a same member and has a substantially same capillary force.

Also in the heat transport device 2, a first wick structure 14 provided in the first heat transport section 10, and the reflux promoting body 34 provided in the tube body 51 may be connected via a connection member 35 having a capillary force.

A shape of the tube body 51 is not particularly limited, a shape in the longitudinal direction is a straight-line shape, and a shape in an orthogonal direction (radial direction) to the longitudinal direction is an elliptical shape, in the heat transport device 2. Further, each of the tube bodies 51 also has a substantially same shape and size. As the material of the tube body 51 that forms the second heat transport section 20, it is possible to cite, for example, copper, a copper alloy, aluminum, an aluminum alloy, nickel, or a nickel alloy, stainless steel, titanium, a titanium alloy, and the like, like the material of the container 29 of the second heat transport section 20.

As shown in FIGS. 5 to 7, in the heat transport device 2, a plurality of first heat dissipation fins 61, 61, 61 . . . that are heat exchange sections are thermally connected to the tube body 51. The plurality of first heat dissipation fins 61, 61, 61 . . . are disposed in parallel along the longitudinal direction of the tube body 51. The tube body 51 is fitted into each of a plurality of through-holes formed in the first heat dissipation fin 61, whereby the first heat dissipation fin 61 is mounted and fixed to a position of the tube body 51, and the first heat dissipation fin 61 is thermally connected to the plurality of tube bodies 51, 51, 51 . . . . From the above, the heat transport device 2 is a heat sink in which the plurality of first heat dissipation fins 61, 61, 61 . . . are thermally connected to the second heat transport section 20.

Further, as shown in FIG. 6, a plurality of second heat dissipation fins 62, 62, 62 . . . that are heat exchange sections are thermally connected to the condensation section 12 of the first heat transport section 10 (not illustrated for convenience of explanation in FIG. 5). The plurality of second heat dissipation fins 62, 62, 62 . . . are disposed in parallel along a width direction of the first heat transport section 10. The second heat dissipation fin 62 is mounted and fixed to the position of the first heat transport section 10, and is thermally connected to the first heat transport section 10. The first heat dissipation fin 61 and the second heat dissipation fin 62 are both thin flat-plate-shaped members.

Also in the heat transport device 2, a capillary force of the first wick structure 14 provided in the cavity portion 13 of the first heat transport section 10 and extending to the condensation section 12 from the evaporation section 11 is larger than the capillary force of the reflux promoting body 34 provided on the second wick structure 24 formed on the inner surface of the tube body 51 that is the second heat transport section 20, the capillary force of the reflux promoting body 34 is larger than the capillary force of the second wick structure 24, or the capillary force of the reflux promoting body 34 is substantially equal to the capillary force of the second wick structure 24, so that the second wick structure 24 and the reflux promoting body 34 are provided on the inner surface of the tube body 51, and the capillary force of the first wick structure 14 provided in the first heat transport section 10 including the evaporation section 11 is in a mode of being relatively large. Accordingly, also in the heat transport device 2, a reflux of the working fluid in a liquid phase to the direction of the connection portion 30 with the first heat transport section 10 from the tip end portion 33 of the tube body 51 and a reflux of the working fluid in a liquid phase to the evaporation section 11 from the condensation section 12 of the first heat transport section 10 are facilitated even under the usage conditions in which the heating element 100 with a high heat generation amount is thermally connected, or under the usage conditions in which a flow rate of the cooling air is increased. Furthermore, also in the heat transport device 2, both the second wick structure 24 and the reflux promoting body 34 that are provided on the inner surface of the tube body 51 have relatively small capillary forces, and therefore it is possible to prevent the working fluid in a liquid phase from being retained and accumulating in the tube body 51.

Further, also in the heat transport device 2, the working fluid in a liquid phase that flows back to the direction of the connection portion 30 with the first heat transport section 10 from the tip end portion 33 of the tube body 51 in the second wick structure 24 is protected from a flow of the working fluid in a gas phase that is a counterflow, by the reflux promoting body 34, and further, the reflux promoting body 34 also contributes to the reflux of the working fluid in a liquid phase to the direction of the connection portion 30 with the first heat transport section 10 from the tip end portion 33 of the tube body 51. Furthermore, an interface portion between the second wick structure 24 and the reflux promoting body 34 also contributes to the reflux of the working fluid in a liquid phase to the direction of the connection portion 30 with the first heat transport section 10 from the tip end portion 33 of the tube body 51. From the above, also in the heat transport device 2, it is possible to prevent the working fluid in the evaporation section 11 from drying out even in the usage conditions in which the heating element 100 with a high heat generation amount is thermally connected, or the usage conditions in which the flow rate of cooling air is increased.

Next, a heat transport device according to a third embodiment of the present disclosure will be described with use of the drawings. Note that the heat transport device according to the third embodiment shares a main part with the heat transport devices according to the first and second embodiments, and therefore same components as the components of the heat transport devices according to the first and second embodiments will be described by using the same reference signs. Note that FIG. 8 is a side view of the heat transport device according to the third embodiment of the present disclosure.

Figure 8:
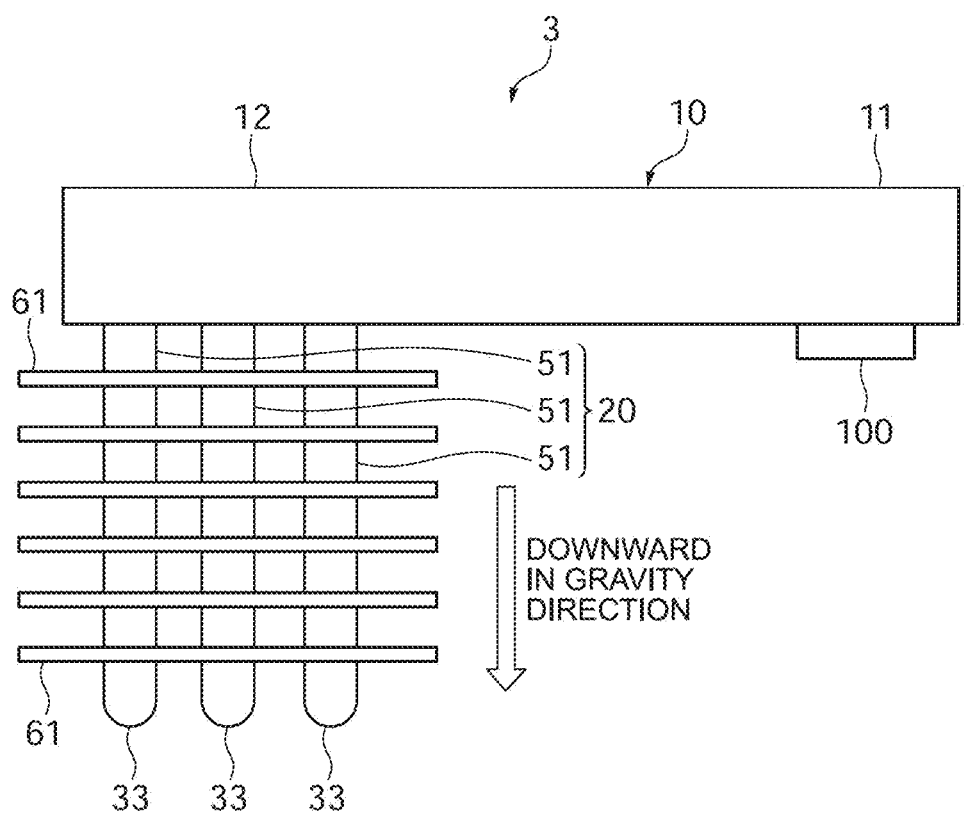
FIG. 8 is a side view of a heat transport device according to a third embodiment of the present disclosure.

In the heat transport devices 1 and 2 of the first and second embodiments, the second heat transport section 20 extends in the substantially orthogonal direction to the heat transport direction of the first heat transport section 10 along the planar direction of the condensation section 12 of the first heat transport section 10, but as shown in FIG. 8, in a heat transport device 3 according to the third embodiment, a second heat transport section 20 extends in a perpendicular direction to a planar direction of a condensation section 12 of a first heat transport section 10, and in a substantially orthogonal direction to a heat transport direction of the first heat transport section 10.

In the heat transport device 3, the second heat transport section 20 is composed of a plurality of tube bodies 51, 51, 51 . . . , and the plurality of tube bodies 51, 51, 51 . . . forming the second heat transport section 20 extend downward in the gravity direction. In the heat transport device 3, one second heat transport section 20 is provided. Since a tip end portion 33 of the second heat transport section 20 is installed below an evaporation section 11 of the first heat transport section 10 in the gravity direction, it is preferable that a reflux promoting body covers a region of 50% or more and 100% or less of a peripheral length in a section in an orthogonal direction to a heat transport direction of the tube body 51, from a viewpoint of reliably promoting a reflux of the working fluid in a liquid phase to the first heat transport section 10 from the tip end portion 33 of the second heat transport section 20.

Also in the heat transport device 3, a second wick structure and the reflux promoting body are provided on an inner surface of the tube body 51, and a capillary force of a first wick structure provided in the first heat transport section 10 including the evaporation section 11 is in a mode of being relatively large, so that a reflux of the working fluid in a liquid phase to a direction of the first heat transport section 10 from the tip end portion 33 of the tube body 51 and a reflux of the working fluid in a liquid phase to the evaporation section 11 from the condensation section 12 of the first heat transport section 10 are facilitated even under usage conditions in which a heating element 100 with a high heat generation amount is thermally connected or usage conditions in which a flow rate of cooling air is increased.

Next, a heat transport device according to a fourth embodiment of the present disclosure will be descried with use of the drawings. Note that the heat transport device according to the fourth embodiment shares a main part with the heat transport devices according to the first to third embodiments, and therefore same components as the components of the heat transport devices according to the first to third embodiments will be described by using the same reference signs. Note that FIG. 9 is a sectional front view explaining an outline of an inside of a second heat transport section of the heat transport device according to the fourth embodiment of the present disclosure.

Figure 9:
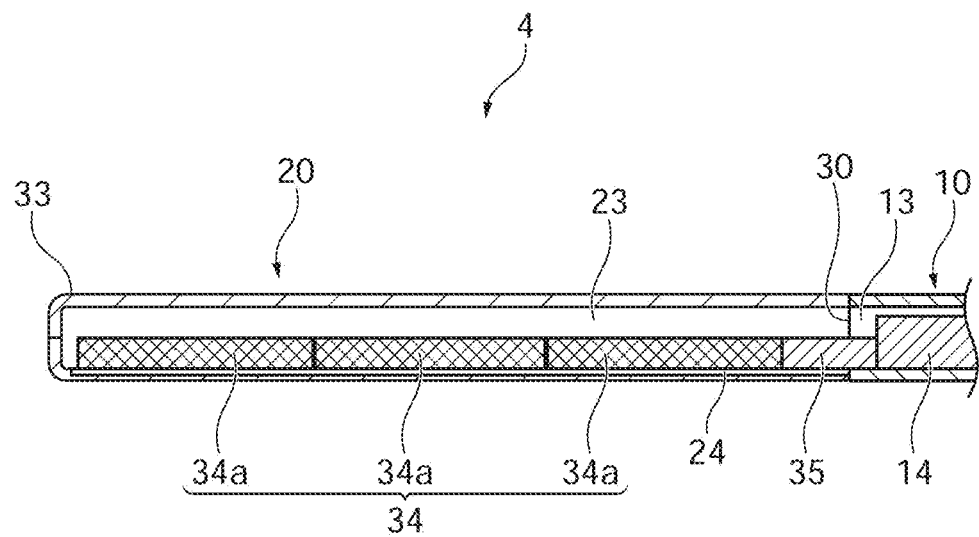
FIG. 9 is a sectional front view explaining an outline of an inside of a second heat transport section of a heat transport device according to a fourth embodiment of the present disclosure.

In each of the heat transport devices 1, 2 and 3 according to the first to third embodiments, the entire reflux promoting body 34 is formed of the same member, and the entire reflux promoting body 34 has substantially the same capillary force, whereas as shown in FIG. 9, in a heat transport device 4 according to the fourth embodiment, the reflux promoting body 34 has a structure in which the reflux promoting body 34 is composed of a plurality of reflux promoting units 34a, 34a, 34a . . . , and capillary forces of the plurality of reflux promoting units 34a, 34a, 34a . . . are different from one another. Note that, in FIG. 9, the reflux promoting body 34 has three reflux promoting units 34a for convenience of explanation, but the number of reflux promoting units 34a to be installed is not particularly limited as long as the number is plural.

A capillary force of each of the reflux promoting units 34a is in a mode of being smaller than a capillary force of a first wick structure 14 correspondingly to that the capillary force of the first wick structure 14 is in a mode of being larger than a capillary force of the reflux promoting body 34. Further, the capillary force of each of the reflux promoting units 34a is also in a mode of being larger than a capillary force of a second wick structure 24, or being substantially equal to the capillary force of the second wick structure 24 correspondingly to that the capillary force of the reflux promoting body 34 is in a mode of being larger than the capillary force of the second wick structure 24, or substantially equal to the capillary force of the second wick structure 24.

The plurality of reflux promoting units 34a, 34a, 34a . . . are disposed to be continuously connected along a heat transport direction of a second heat transport section 20. In the heat transport device 4, the plurality of reflux promoting units 34a, 34a, 34a . . . are disposed to be in direct contact with one another. When the reflux promoting units 34a are metal mesh, for example, it is possible to select a magnitude of a capillary force of each of the plurality of reflux promoting units 34a, 34a, 34a . . . by adjusting a thickness of the metal mesh, and when the reflux promoting unit 34a is a sintered body of metal powder, it is possible to select the magnitude of the capillary force by adjusting a porosity of the sintered body.

The capillary forces of the plurality of reflux promoting units 34a, 34a, 34a . . . are different from one another, and thereby it is possible to set the capillary force of the reflux promoting body 34 to a larger capillary force as progress from the tip end portion 33 of the second heat transport section 20 toward the first heat transport section 10, so that the reflux of the working fluid in a liquid phase to the direction of the first heat transport section 10 from the tip end portion 33 of the second heat transport section 20 is further facilitated.

Next, another embodiment of the heat transport device of the present disclosure will be described hereinafter. In each of the heat transport devices of the above-described first and second embodiments, the plurality of second heat transport sections are provided, but instead of this, the number of second heat transport sections may be one.

Since the heat transport device of the present disclosure can prevent the working fluid in the evaporation section from drying out even under the usage conditions in which an input heat amount is high and the flow rate of the cooling air is increased, the heat transport device has a high utility value in the field of cooling an electronic component with a high heat generation amount mounted on a circuit board, for example, an electronic component such as a central processing unit, for example.

What is claimed is:

1. A heat transport device, comprising:
a first heat transport section including an evaporation section thermally connected to a heating element; and
a second heat transport section connected at a condensation section of the first heat transport section, and having a heat transport direction different from a heat transport direction of the first heat transport section,
the first heat transport section including an integral internal space that provides communication from the evaporation section to a connection portion with the second heat transport section and has a working fluid enclosed in the internal space, the internal space of the first heat transport section communicating with an internal space of the second heat transport section,
the heat transport device comprising a first wick structure provided in the internal space of the first heat transport section, and extending from the evaporation section to the condensation section;
a second wick structure provided on an inner surface of the second heat transport section, and extending along the heat transport direction of the second heat transport section; and
a reflux promoting body in contact with the second wick structure, extending along the heat transport direction of the second heat transport section, and having a capillary force,
wherein a capillary force of the first wick structure is larger than the capillary force of the reflux promoting body, and the capillary force of the reflux promoting body is larger than a capillary force of the second wick structure, or the capillary force of the reflux promoting body is equal to the capillary force of the second wick structure, and
the reflux promoting body is located on the inner surface of the second heat transport section, the reflux promoting body is provided on a lower side in a gravity direction and is not provided on an upper side in the gravity direction.

2. A heat transport device, comprising:
a first heat transport section including an evaporation section thermally connected to a heating element; and
a second heat transport section connected at a condensation section of the first heat transport section, and having a heat transport direction different from a heat transport direction of the first heat transport section,
the first heat transport section including an integral internal space that provides communication from the evaporation section to a connection portion with the second heat transport section and has a working fluid enclosed in the internal space, the internal space of the first heat transport section communicating with an internal space of the second heat transport section,
the heat transport device comprising a first wick structure provided in the internal space of the first heat transport section, and extending from the evaporation section to the condensation section;
a second wick structure provided on an inner surface of the second heat transport section, and extending along the heat transport direction of the second heat transport section; and
a reflux promoting body in contact with the second wick structure, extending along the heat transport direction of the second heat transport section, and having a capillary force,
wherein a capillary force of the first wick structure is larger than the capillary force of the reflux promoting body, and the capillary force of the reflux promoting body is larger than a capillary force of the second wick structure, or the capillary force of the reflux promoting body is equal to the capillary force of the second wick structure, and
the reflux promoting body covers a region of 5% or more and 50% or less of a peripheral length of a section, the section being in an orthogonal direction to the heat transport direction of the second heat transport section.

3. A heat transport device, comprising:
a first heat transport section including an evaporation section thermally connected to a heating element; and
a second heat transport section connected at a condensation section of the first heat transport section, and having a heat transport direction different from a heat transport direction of the first heat transport section,
the first heat transport section including an integral internal space that provides communication from the evaporation section to a connection portion with the second heat transport section and has a working fluid enclosed in the internal space, the internal space of the first heat transport section communicating with an internal space of the second heat transport section,
the heat transport device comprising a first wick structure provided in the internal space of the first heat transport section, and extending from the evaporation section to the condensation section;
a second wick structure provided on an inner surface of the second heat transport section, and extending along the heat transport direction of the second heat transport section; and
a reflux promoting body in contact with the second wick structure, extending along the heat transport direction of the second heat transport section, and having a capillary force,
wherein a capillary force of the first wick structure is larger than the capillary force of the reflux promoting body, and the capillary force of the reflux promoting body is larger than a capillary force of the second wick structure, or the capillary force of the reflux promoting body is equal to the capillary force of the second wick structure, and
the second heat transport section is installed so that a tip end portion of the second heat transport section is lower in a gravity direction than the connection portion with the first heat transport section.

4. The heat transport device according to claim 1, wherein the second heat transport section is installed so that an extending direction of the second heat transport section is an orthogonal direction to the gravity direction.

5. The heat transport device according to claim 1, wherein the first wick structure and the reflux promoting body are connected via a connection member having a capillary force.

6. The heat transport device according to claim 5, wherein a capillary force of the first wick structure is larger than the capillary force of the connection member, and the capillary force of the connection member is larger than the capillary force of the reflux promoting body, or the capillary force of the connection member is the same as the capillary force of the reflux promoting body.

7. The heat transport device according to claim 6, wherein the connection member is located at a connection portion between the first heat transport section and the second heat transport section.

8. The heat transport device according to claim 1, wherein the reflux promoting body includes a plurality of reflux accelerating portions, and capillary forces of the plurality of reflux accelerating portions are different from each other.

9. The heat transport device according to claim 1, wherein the container of the first heat transport section has a planar edge.

10. The heat transport device according to claim 1, wherein the container of the second heat transport section is of a planar type having an integrated internal space.

11. The heat transport device according to claim 1, wherein the second heat transport section includes a plurality of pipe bodies.

12. The heat transport device according to claim 11, wherein the plurality of pipe bodies extends in a plurality of directions from the first heat transport section.

13. The heat transport device according to claim 11, wherein the plurality of pipe bodies extends downward in the direction of gravity.

14. The heat transport device according to claim 1, wherein the heat transport device is a heat sink in which a plurality of heat radiation fins is thermally connected to the second heat transport section.

15. The heat transport device according to claim 1, wherein the reflux promoting body is a wick member having a capillary force and has a structure different from structures of the first wick structure and the second wick structure.

16. The heat transport device according to claim 2, wherein the reflux promoting body is a wick member having a capillary force and has a structure different from structures of the first wick structure and the second wick structure.

17. The heat transport device according to claim 3, wherein the reflux promoting body is a wick member having a capillary force and has a structure different from structures of the first wick structure and the second wick structure.

* * * * *